(12) United States Patent
Aoki

(10) Patent No.: US 7,986,528 B2
(45) Date of Patent: Jul. 26, 2011

(54) COOLING PLATE STRUCTURE OF COOLING APPARATUS AND TRANSMITTER WITH THE COOLING APPARATUS

(75) Inventor: Kensuke Aoki, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 159 days.

(21) Appl. No.: 12/323,328

(22) Filed: Nov. 25, 2008

(65) Prior Publication Data
US 2009/0139706 A1    Jun. 4, 2009

(30) Foreign Application Priority Data
Dec. 4, 2007    (JP) .................................. 2007-313830

(51) Int. Cl.
*H05K 7/20*    (2006.01)
*F28F 7/00*    (2006.01)
*H01L 23/34*    (2006.01)

(52) U.S. Cl. ...... 361/702; 361/699; 165/80.4; 165/80.5; 165/104.33; 257/714; 174/15.1

(58) Field of Classification Search .................. 361/699, 361/702; 165/80.3–80.5, 104.33; 257/714, 257/716; 174/15.1
See application file for complete search history.

(56) References Cited

U.S. PATENT DOCUMENTS

| | | | | |
|---|---|---|---|---|
| 4,884,168 A | * | 11/1989 | August et al. .................. 361/702 |
| 5,826,643 A | * | 10/1998 | Galyon et al. ............... 165/80.4 |
| 5,899,077 A | * | 5/1999 | Wright et al. ................... 62/3.7 |
| 6,388,317 B1 | | 5/2002 | Reese | |
| 6,782,195 B2 | * | 8/2004 | Abras et al. ................... 392/480 |
| 7,072,180 B2 | * | 7/2006 | Nishiura ....................... 361/699 |
| 7,529,091 B2 | * | 5/2009 | Olesen et al. ................. 361/701 |
| 2004/0190318 A1 | | 9/2004 | Tsuchiya et al. | |
| 2007/0017658 A1 | * | 1/2007 | Lehman et al. .............. 165/80.4 |

FOREIGN PATENT DOCUMENTS

| | | |
|---|---|---|
| CN | 1545001 A | 11/2004 |
| JP | 49-005364 | 4/1974 |
| JP | 2002-270748 | 9/2002 |

OTHER PUBLICATIONS

Notice of Reasons for Rejection dispatched Jun. 8, 2010 from the Japanese Patent Office for counterpart Japanese Patent Application No. 2007-313830 and English translation thereof.

(Continued)

*Primary Examiner* — Zachary M Pape
(74) *Attorney, Agent, or Firm* — Finnegan, Henderson, Farabow, Garrett & Dunner, L.L.P.

(57) ABSTRACT

A cooling plate structure of a cooling apparatus includes a cooling plate and at least one refrigerant circulating conduit disposed in the cooling plate. The conduit includes refrigerant introducing and discharging ports disposed side by side on an outer surface of the cooling plate in an exposed state, a flow-in part extending from the introducing port to an intermediate position between the introducing port and the discharging port in the cooling plate, and a flow-out part extending along the flow-in part from the intermediate position to the discharging port such that flow-out part is separated from the flow-in part. Heat generating elements are disposed along the circulating conduit at an intermediate portion between a flow-in part corresponding portion and a flow-out part corresponding portion, both corresponding to the flow-in part and flow-out part of the circulating conduit, on the outer surface of the cooling plate.

10 Claims, 3 Drawing Sheets

OTHER PUBLICATIONS

Notice of Reasons for Rejection dispatched Oct. 13, 2009 from the Japanese Patent Office for counterpart Japanese Patent Application No. 2007-313830 and English translation thereof.

Office Action issued on Sep. 14, 2010 from the Canadian Patent Office for Canadian Application No. 2,645,751, 3 pages.
Office Action issued on Oct. 12, 2010 from the Chinese Patent Office for Chinese Patent Application No. 200810178893.3 (4 pages).

* cited by examiner

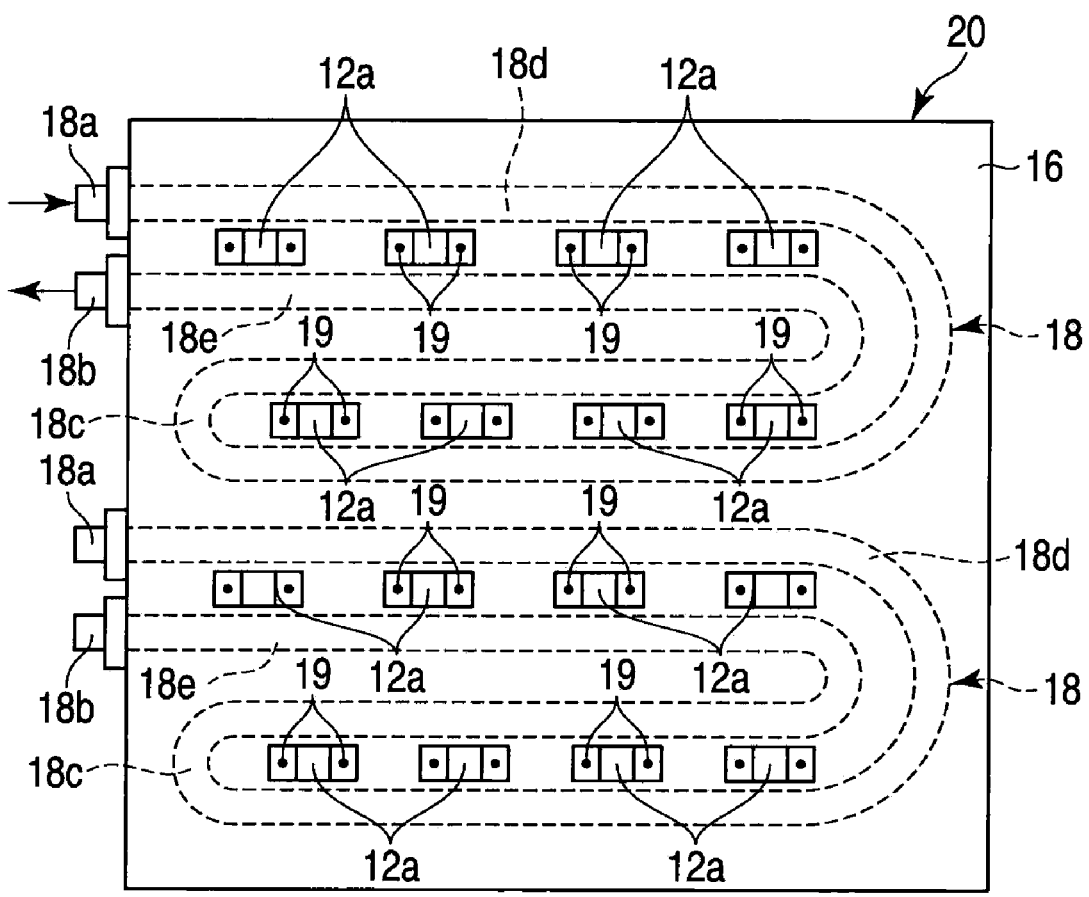
F I G. 5

COOLING PLATE STRUCTURE OF COOLING APPARATUS AND TRANSMITTER WITH THE COOLING APPARATUS

CROSS-REFERENCE TO RELATED APPLICATIONS

This application is based upon and claims the benefit of priority from prior Japanese Patent Application No. 2007-313830, filed Dec. 4, 2007, the entire contents of which are incorporated herein by reference.

BACKGROUND OF THE INVENTION

1. Field of the Invention

This invention relates to a cooling plate structure of a cooling apparatus and a transmitter with the cooling apparatus.

2. Description of the Related Art

The cooling plate structure which is used in a cooling apparatus for cooling a plurality of heat generating elements has been well known. The conventional cooling plate structure includes a cooling plate and at least one refrigerant circulating conduit extending in the cooling plate. The cooling plate has an excellent thermal conductivity and an outer surface to which the plurality of heat generating elements are connected thermally. The at least one refrigerant circulating conduit has an excellent thermal conductivity, includes a refrigerant introducing port and a refrigerant discharging port both of which are exposed on the outer surface of the cooling plate, and extends from the refrigerant introducing port to the refrigerant discharging port in the cooling plate.

For example, it is well known that the transmitter, particularly a transmitter for broadcasting, generates a large amount of heat during its operation. If the temperature of the transmitter is raised, various electric or electronic elements which constitute an electric circuit of the transmitter cannot perform a predetermined function. Thus, a conventional transmitter is provided with a cooling apparatus for cooling these various electric or electronic elements which constitute the electric circuit.

The conventional transmitter usually uses a cooling apparatus which employs the aforementioned cooling plate structure. And, electric or electronic elements each of which generates relatively large amount of heat (hereinafter referred to as heat generating elements), for example power amplifiers, in the various electric or electronic elements constituting the electric circuit of the conventional transmitter, are connected thermally to the cooling plate of the cooling plate structure. In this specification, "Thermally connected" includes any connecting style which allows heat transmission.

The cooling plate is formed of a material having an excellent thermal conductivity, such as copper, aluminum, and alloy thereof. As the refrigerant, for example, water mixed with antifreeze solution is used. The refrigerant is supplied from a radiator to the refrigerant introducing port of the refrigerant circulating conduit of the cooling plate structure, and absorbs heat transmitted to the cooling plate from the heat generating elements while the refrigerant is circulated in the refrigerant circulating conduit in the cooling plate. Then, the refrigerant is returned to the radiator from the refrigerant discharging port of the refrigerant circulating conduit, and, after heat is radiated from the refrigerant by the radiator, the refrigerant is supplied from the radiator to the refrigerant introducing port of the refrigerant circulating conduit of the cooling plate structure.

In the technical field of the transmitter in recent years, amount of heat generated from the heat generating elements of the transmitter increases with improvement of the performance of the transmitter, so that it has been strongly demanded to improve the cooling performance of the cooling plate structure of the cooling apparatus used in the transmitter.

Japanese Patent Application KOKAI Publication No. 2005-197454 discloses a cooling plate structure of a cooling apparatus for a transmitter, which has an improved cooling performance as compared with that of the conventional cooling apparatus. In this cooling plate structure, the refrigerant introducing port and refrigerant discharging port of one refrigerant circulating conduit are arranged side by side on the cooling plate, further a flow-in part of the refrigerant circulating conduit, which extends from the refrigerant introducing port to an intermediate position between the refrigerant introducing port and the refrigerant discharging port, meanders and a flow-out part of the refrigerant circulating conduit, which extends from the intermediate position to the refrigerant discharging port, also meanders adjacently to the flow-in part. Specifically, the refrigerant circulating conduit is partitioned into the flow-in part and the flow-out part by a common partition wall except at the intermediate position and meanders from the refrigerant introducing port to the refrigerant discharging port in the cooling plate.

A plurality of heat generating elements are disposed on the cooling plate to correspond to plural positions along the adjacent flow-in and flow-out parts of the single refrigerant circulating conduit. Each of the plural heat generating elements has an opposed surface which opposes each of the corresponding positions, and each heat generating element is disposed at each corresponding position such that halves of the opposed surface correspond to the flow-in part and the flow-out part of the refrigerant circulating conduit, respectively.

With such a conventional cooling plate structure, the plural heat generating elements disposed at the plural positions along the adjacent flow-in and flow-out parts of the one refrigerant circulating conduit on the cooling plate can be cooled equally.

However, in the conventional cooling plate structure, it is a troublesome work to partition the refrigerant circulating conduit into the flow-in part and the flow-out part by the common partition wall except at the intermediate position. Further, the area (that is, heat exchanging area) of the outer surface of the refrigerant circulating conduit making in contact with the cooling plate while the refrigerant circulating conduit extends from the refrigerant introducing port to the refrigerant discharging port in the cooling plate is small as compared with a case where the flow-in part and flow-out part of the refrigerant circulating conduit are not disposed adjacently to each other with any common partition wall but independent from each other. That is, there is a large difference in cooling performance between a narrow band-like area along the adjacent flow-in and flow-out parts of the single refrigerant circulating conduit and the other area on the cooling plate. As a result, the cooling performance of the entire cooling plate having such a conventional cooling plate structure is smaller than that of the cooling plate structure in which the flow-in part and flow-out part of the refrigerant circulating conduit are not disposed adjacently to each other with any common partition wall but independent from each other.

Further, the kinds of work for thermally connecting the plural heat generating elements directly to the plural positions along the adjacent flow-in and flow-out parts of the single refrigerant circulating conduit on the cooling plate are limited, because the work must be done so as not to damage the adjacent flow-in part and flow-out part of the refrigerant circulating conduit at each corresponding portion. For example, after each heat generating element is connected thermally and directly onto a heat generating element supporting member which is made of excellent heat conductive material and which is configured to cross over the adjacent flow-in part and flow-out part of the refrigerant circulating conduit at each corresponding position on the cooling plate, both end parts of the heat generating element supporting member with the heat generating element are fixed to both outer sides of the adjacent flow-in part and flow-out part of the refrigerant circulating conduit at each corresponding position on the cooling plate with fixing members made of excellent heat conductive material, for example, fixing screws.

Such a heat generating element supporting member not only makes the conventional cooling plate structure having the above-described configuration being complicated but also makes an assembling work thereof being troublesome, thereby reducing the efficiency of heat transmission from the heat generating elements to the corresponding positions on the cooling plate.

BRIEF SUMMARY OF THE INVENTION

According to one aspect of this invention, a cooling plate structure of a cooling apparatus for cooling a plurality of heat generating elements, comprises: a cooling plate which has an excellent thermal conductivity and an outer surface to which the plurality of heat generating elements are connected thermally; and at least one refrigerant circulating conduit which has an excellent thermal conductivity and which includes a refrigerant introducing port and a refrigerant discharging port disposed side by side on the outer surface of the cooling plate in an exposed state. The at least one refrigerant circulating conduit further includes a flow-in part extending from the refrigerant introducing port to an intermediate position between the refrigerant introducing port and the refrigerant discharging port in the cooling plate, and a flow-out part extending along the flow-in part from the intermediate position to the refrigerant discharging port such that flow-out part is separated from the flow-in part. The plurality of heat generating elements are disposed along the refrigerant circulating conduit at an intermediate portion between a flow-in part corresponding portion and a flow-out part corresponding portion both of which correspond to the flow-in part and flow-out part of the refrigerant circulating conduit on the outer surface of the cooling plate.

According to one aspect of this invention, a transmitter comprises: an electric circuit which includes a plurality of heat generating elements, which are supplied with electricity and generate heat, and which is configured to transmit electric waves containing information; and a cooling apparatus which is configured to cool the plurality of heat generating elements in the electric circuit. The cooling apparatus comprises: a cooling plate structure including a cooling plate which has an excellent thermal conductivity and an outer surface to which the plurality of heat generating elements are connected thermally, and at least one refrigerant circulating conduit which has an excellent thermal conductivity and which includes a refrigerant introducing port and a refrigerant discharging port disposed side by side on the outer surface of the cooling plate in an exposed state. The at least one refrigerant circulating conduit further includes a flow-in part extending from the refrigerant introducing port to an intermediate position between the refrigerant introducing port and the refrigerant discharging port in the cooling plate, and a flow-out part extending along the flow-in part from the intermediate position to the refrigerant discharging port such that flow-out part is separated from the flow-in part. The plurality of heat generating elements are disposed along the refrigerant circulating conduit at an intermediate portion between a flow-in part corresponding portion and a flow-out part corresponding portion both of which correspond to the flow-in part and flow-out part of the refrigerant circulating conduit on the outer surface of the cooling plate. The cooling apparatus further comprises a radiator which is connected to the refrigerant introducing port and refrigerant discharging port of the refrigerant circulating conduit and which radiates heat from refrigerant discharged from the refrigerant discharging port and supplies the heat radiated refrigerant to the refrigerant introducing port.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view showing schematically a second modification of the cooling plate structure shown in FIG. 2.

DETAILED DESCRIPTION OF THE INVENTION

Figure 1:
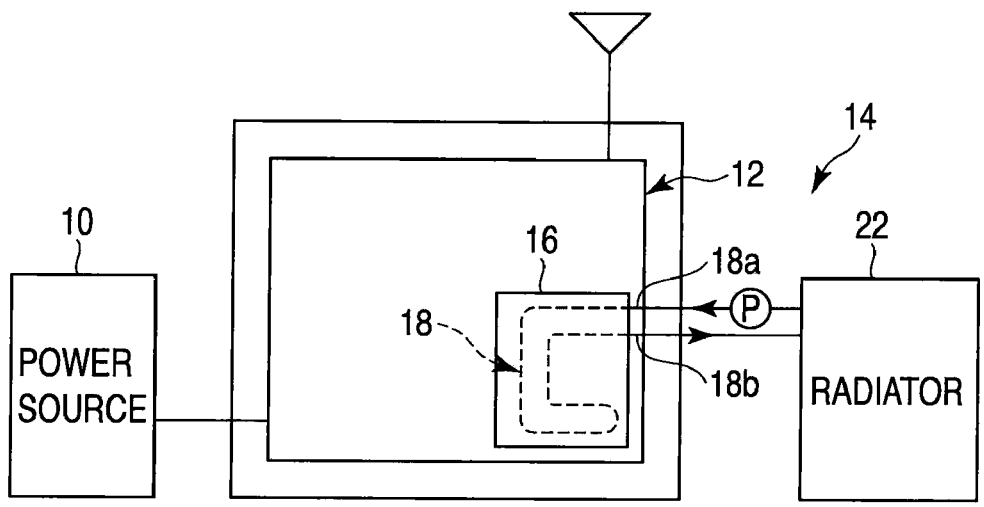
FIG. 1 is a view showing schematically a structure of a transmitter with a cooling apparatus according to an embodiment of the present invention.

As shown in FIG. 1, a transmitter with a cooling apparatus, according to an embodiment of the present invention, includes: a known electric circuit 12 which includes a plurality of heat generating elements, each generating heat when it is supplied with electricity from a known power supply 10, and which is configured to transmit electric waves containing information; and a cooling apparatus 14 which is configured to cool the plural heat generating elements of the electric circuit 12. In this embodiment, the transmitter is used for broadcasting.

Figure 2:
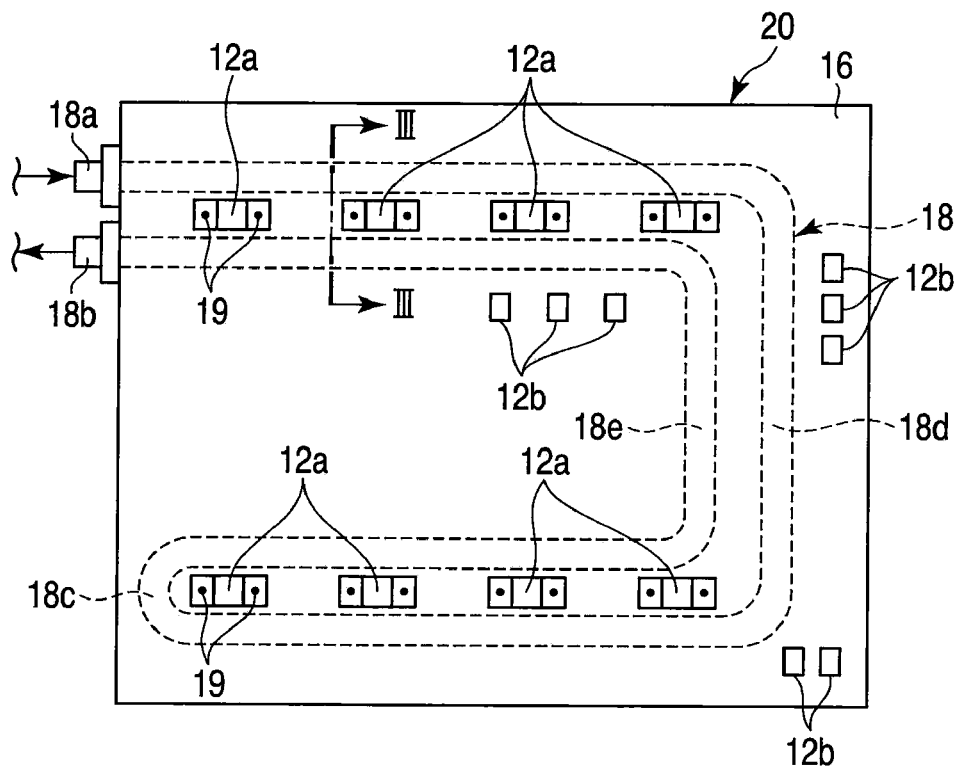
FIG. 2 is a view showing schematically a cooling plate structure of the cooling apparatus in FIG. 1.

As shown in FIG. 2, the cooling apparatus 14 includes a cooling plate 16 having an excellent thermal conductivity and having an outer surface to which the plural heat generating elements 12a of the electric circuit 12 are connected thermally. The cooling plate 16 is formed of excellent thermal conductive material, such as aluminum, copper and alloy thereof. The "thermally connected" mentioned here includes any connecting style which allows heat transmission.

The cooling apparatus 14 further includes at least one refrigerant circulating conduit 18 having an excellent thermal conductivity, including a refrigerant introducing port 18a and a refrigerant discharging port 18b both of which are disposed side by side on the outer surface of the cooling plate 16 in an exposed state, and extending from the refrigerant introducing port 18a to the refrigerant discharging port 18b in the cooling plate 16. The refrigerant circulating conduit 18 is formed of excellent thermal conductive material such as aluminum, copper and alloys thereof.

A combination of the cooling plate 16 and the at least one refrigerant circulating conduit 18 configures a cooling plate structure 20.

Specifically, the at least one refrigerant circulating conduit 18 includes a flow-in part 18d extending from the refrigerant introducing port 18a to an intermediate position 18c between the refrigerant introducing port 18a and the refrigerant discharging port 18b, and a flow-out part 18e extending along the flow-in part 18d from the intermediate position 18c to the refrigerant discharging port 18b such that the flow-out part 18e is separated from the flow-in part 18d. In this embodiment, the flow-in part 18d and flow-out part 18e of the refrigerant circulating conduit 18 are extended substantially in parallel to each other from the refrigerant introducing port 18a to the refrigerant discharging port 18b except at the intermediate position 18c.

The cooling apparatus 14 further includes a radiator 22 connected to the refrigerant introducing port 18a and refrigerant discharging port 18b of the refrigerant circulating conduit 18, radiating heat from refrigerant discharged from the refrigerant discharging port 18b, and supplying the heat radiated refrigerant to the refrigerant supply port 18a. In this embodiment, the refrigerant is water mixed with antifreeze solution.

The plurality of heat generating elements 12a are disposed along the refrigerant circulating conduit 18 at an intermediate portion located between a flow-in part corresponding portion and a flow-out part corresponding portion, both of which correspond to the flow-in part 18d and flow-out part 18e of the refrigerant circulating conduit 18, on the outer surface of the cooling plate 16.

The plural heat generating elements 12a of the electric circuit 12 are electric or electronic elements each of which generates relatively large amount of heat in the various electric or electronic elements constituting the electric circuit 12, and the heat generating elements 12a are usually power amplifiers in case of the electric circuit 12 of the transmitter. In this embodiment, each heat generating element 12a is so configured that a part of its outer surface makes an intimate contact with a predetermined position on the outer surface of the cooling plate 16, and it is fixed to the predetermined position on the outer surface of the cooling plate 16 with known fixing elements (for example, fixing screws or fixing pins) 19 made of excellent thermal conductive material such as aluminum, copper and alloy thereof.

Other various electric and electronic elements 12b, excluding the plural heat generating elements 12a, which do not generate relatively large amount of heat in the various electric or electronic elements constituting the electric circuit 12 but require cooling, can be connected thermally to the outer surface of the cooling plate 16 at positions at which the other various electric or electronic elements 12b can obtain a necessary cooling performance.

Depending on the positions along the refrigerant circulating conduit 18 and a distance of each position from the refrigerant circulating conduit 18 on the outer surface of the cooling plate 16, the various electric and electronic elements 12b can obtain different cooling performances.

Figure 3:
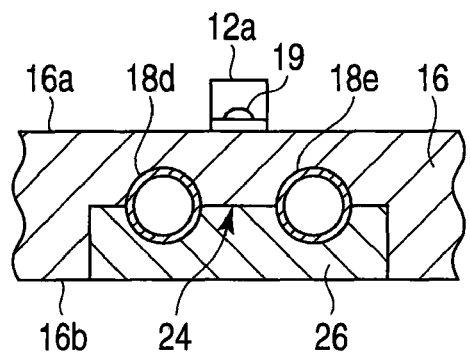
FIG. 3 is a sectional view showing schematically a section along a line III-III of FIG. 2.

As shown in FIG. 3, the outer surface of the cooling plate 16 includes a pair of flat parts 16a, 16b which direct in opposite directions to each other. In one of the pair of the flat parts 16a, 16b, the flow-in part corresponding portion, the flow-out part corresponding portion, and the intermediate portion are dented integrally to provide a dent 24. In the dent 24, the flow-in part 18d, flow-out part 18e, and intermediate position 18c of the refrigerant circulating conduit 18 are disposed, and further a lid 26 having an excellent thermal conductivity is disposed in the dent 24 to cover the flow-in part 18d, flow-out part 18e, and intermediate position 18c of the refrigerant circulating conduit 18.

The lid 26 is formed of an excellent thermal conductive material such as aluminum, copper or alloy of these, and preferably that material is the same as that of the cooling plate 16.

The lid 26 is connected thermally to the dented surface portion configured by the dent 24, and the flow-in part 18d, flow-out part 18e, and intermediate position 18c of the refrigerant circulating conduit. In this embodiment, such a thermal connection is performed by a known friction diffusion bonding.

In the cooling plate structure 20 used in the transmitter according to the embodiment of the present invention and described with reference to FIGS. 1 to 3, the at least one refrigerant circulating conduit 18 extending between the refrigerant introducing port 18a and the refrigerant discharging port 18b both of which are disposed side by side on the outer surface of the cooling plate 16 in the exposed state includes the flow-in part 18d extending from the refrigerant introducing port 18a to the intermediate position 18c in the cooling plate 16 and the flow-out part 18e extending along the flow-in part 18d from the intermediate position 18c to the refrigerant discharging port 18b such that the flow-out part 18e is separated from the flow-in part 18d. Therefore, the refrigerant circulating conduit 18 is in contact with the cooling plate 16 through the entire outer surfaces of the flow-in part 18d, intermediate position 18c and flow-out part 18e (this means that the whole thermally conductive surface area of the refrigerant circulating conduit 18 to the cooling plate 16 is increased), thereby improving the cooling performance of the refrigerant circulating conduit 18 to the cooling plate 16.

Further, the plurality of heat generating elements 12a, that is the plurality of electric or electronic elements each of which generates a relatively large amount of heat, among the various electric and electronic elements constituting the electric circuit 12 of the transmitter, are disposed along the refrigerant circulating conduit 18 and connected thermally to an intermediate portion between the flow-in part corresponding portion and flow-out part corresponding portion, both of which correspond to the flow-in part 18d and flow-out part 18e of the refrigerant circulating conduit 18, on the outer surface of the cooling plate 16. Thus, heat generated by each of the plural heat generating elements 12a can be transmitted quickly to refrigerant flowing in the refrigerant circulating conduit 18 through both the flow-in part 18d and flow-out part 18e of the refrigerant circulating conduit 18.

Further, the plural heat generating elements 12a are disposed along the refrigerant circulating conduit 18 at the intermediate portion between the flow-in part corresponding portion and the flow-out part corresponding portion, both of which correspond to the flow-in part 18d and flow-out part 18e of the refrigerant circulating conduit 18, on the outer surface of the cooling plate 16. And, no refrigerant circulating conduit 18 exists in the cooling plate 16 inside of the intermediate portion on the outer surface of the cooling plate 16. Thus, the plural heat generating elements 12a can be fixed to the intermediate portion on the outer surface of the cooling plate 16 in a direct contact condition using only the known fixing elements 19. That is, the thermal connection of each heat generating element 12a to the outer surface of the cooling plate 16 can be performed easily with an excellent heat conduction efficiency.

In the cooling plate structure 20 used in the transmitter according to the embodiment of the present invention and described with reference to FIGS. 1 to 3, the flow-in part 18d and the flow-out part 18e of the single refrigerant circulating conduit 18 are bent in parallel to each other once in the cooling plate 16.

Figure 4:
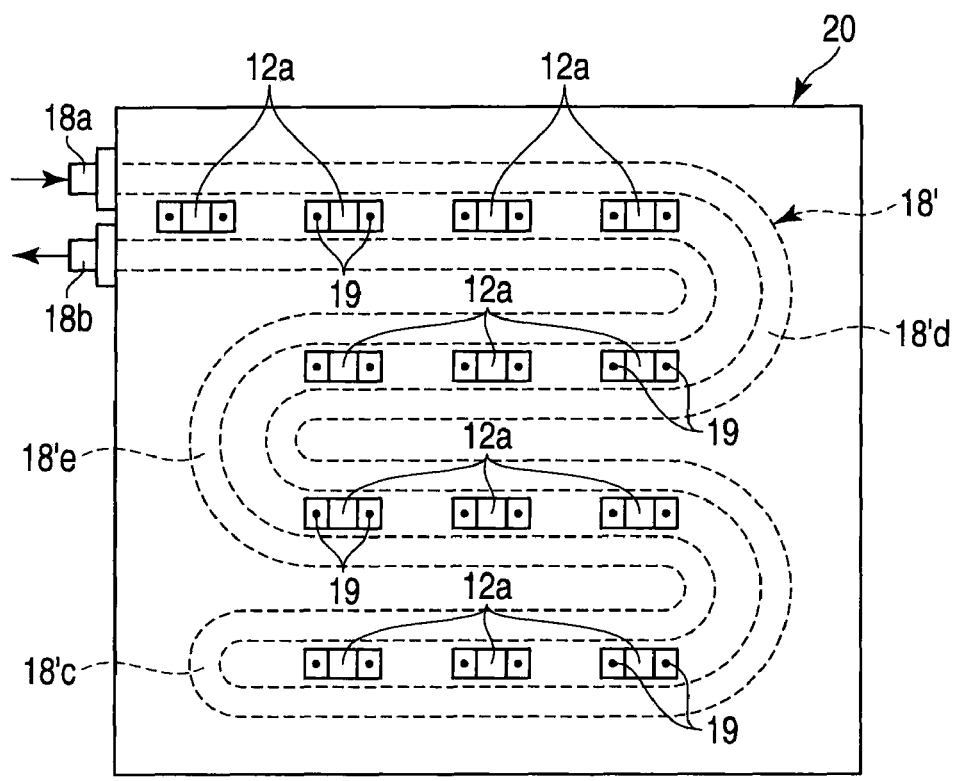
FIG. 4 is a view showing schematically a first modification of the cooling plate structure shown in FIG. 2.

However, according to the concept of the present invention, as shown schematically in FIG. 4, a flow-in part 18'd and flow-out part 18'e of a refrigerant circulating portion 18' may be bent in parallel to each other several times in the cooling plate 16 to meander in the cooling plate 16.

Further, according to the concept of the present invention, as shown schematically in FIG. 5, a plurality of the refrigerant circulating conduits 18 may be disposed in the cooling plate 16. The number of bendings of each of the refrigerant circulating conduits 18 may be equal to one another or different from one another.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cooling plate structure of a cooling apparatus for cooling a plurality of heat generating elements, comprising:
   a cooling plate which has an excellent heat conductivity and an outer surface with which the plurality of heat generating elements make intimate contact; and
   at least one refrigerant circulating conduit which has an excellent heat conductivity, which extends in the cooling plate, and which includes a refrigerant introducing port and a refrigerant discharging port, both of the introducing and the discharging ports disposed adjacently side by side on the outer surface of the cooling plate in an exposed state, a flow-in part extending from the refrigerant introducing port to an intermediate position of the refrigerant circulating conduit and a flow-out part extending from the intermediate position to the refrigerant discharging port,
   wherein the intermediate position of the refrigerant circulating conduit is not located between the refrigerant introducing port and the refrigerant discharging port in the cooling plate, the flow-out part returns from the intermediate position toward the refrigerant introducing and discharging ports along the flow-in part while the flow-out part is adjacent the flow-in part with a gap therebetween, and the plurality of heat generating elements are disposed along both of the flow-in part and the flow-out part of the refrigerant circulating conduit at an intermediate portion between a flow-in part corresponding portion and a flow-out part corresponding portion which respectively correspond to the flow-in part and flow-out part of the refrigerant circulating conduit on the outer surface of the cooling plate.

2. The cooling plate structure of a cooling apparatus according to claim 1, wherein the flow-in and flow-out parts of the refrigerant circulating conduit are bent in parallel to each other at least once in the cooling plate.

3. The cooling plate structure of a cooling apparatus according to claim 2, wherein the flow-in and flow-out parts of the refrigerant circulating conduit are bent in parallel to each other plural times in the cooling plate to meander in the cooling plate.

4. The cooling plate structure of a cooling apparatus according to claim 1, wherein the outer surface of the cooling plate includes a pair of flat parts which directs in opposite directions to each other,
the flow-in part corresponding portion, the flow-out part corresponding portion, and the intermediate portion on one of the pair of flat parts are dented integrally and provide a dent configuring a dented surface portion in the one flat part,
the flow-in part, flow-out part, and intermediate position of the refrigerant circulating conduit are disposed in the dent and further a lid having an excellent thermal conductivity is disposed in the dent to cover the flow-in part, flow-out part, and intermediate position of the refrigerant circulating conduit, and
the dented surface portion configured by the dent, and the flow-in part, the flow-out part and the intermediate position of the refrigerant circulating conduit, and the lid are connected thermally to one another.

5. The cooling plate structure of a cooling apparatus according to claim 4, wherein the thermal connection is performed by a friction diffusion bonding.

6. A transmitter comprising:
   an electric circuit which includes a plurality of heat generating elements, which generate heat when supplied with electricity, the electric circuit being configured to transmit electric waves containing information; and
   a cooling apparatus configured to cool the plurality of heat generating elements in the electric circuit,
   wherein the cooling apparatus comprises:
      a cooling plate structure including
         a cooling plate which has an excellent thermal conductivity and an outer surface with which the plurality of heat generating elements make intimate contact, and
         at least one refrigerant circulating conduit which has an excellent thermal conductivity, which extends in the cooling plate, and which includes a refrigerant introducing port and a refrigerant discharging port, both of the introducing and the discharging ports disposed adjacently side by side on the outer surface of the cooling plate in an exposed state, a flow-in part extending from the refrigerant introducing port to an intermediate position of the refrigerant circulating conduit and a flow-out part extending from the intermediate position to the refrigerant discharging port,
      wherein the intermediate position of the refrigerant circulating conduit is not located between the refrigerant introducing port and the refrigerant discharging port in the cooling plate, the flow-out part returns from the intermediate position toward the refrigerant introducing and discharging ports along the flow-in part while the flow-out part is adjacent the flow-in part with a gap therebetween, and the plurality of heat generating elements are disposed along both of the flow-in part and the flow-out part of the refrigerant circulating conduit at an intermediate portion between a flow-in part corresponding portion and a flow-out part corresponding portion which respectively correspond to the flow-in part and flow-out part of the refrigerant circulating conduit on the outer surface of the cooling plate; and
   a radiator which is connected to the refrigerant introducing port and refrigerant discharging port of the refrigerant circulating conduit and which radiates heat from refrigerant discharged from the refrigerant discharging port and supplies the heat radiated refrigerant to the refrigerant introducing port.

7. The transmitter according to claim 6, wherein the flow-in and flow-out parts of the refrigerant circulating conduit are bent in parallel to each other at least once in the cooling plate of the cooling plate structure of the cooling apparatus.

8. The transmitter according to claim 7, wherein the flow-in and flow-out parts of the refrigerant circulating conduit are bent in parallel to each other plural times in the cooling plate to meander in the cooling plate of the cooling plate structure of the cooling apparatus.

9. The transmitter according to claim 6, wherein the outer surface of the cooling plate of the cooling plate structure of the cooling apparatus includes a pair of flat parts which directs in opposite directions to each other, the flow-in part corresponding portion, the flow-out part corresponding portion, and the intermediate portion on one of the pair of flat parts are dented integrally and provide a dent configuring a dented surface portion in the one flat part, the flow-in part, flow-out part, and intermediate position of the refrigerant circulating conduit are disposed in the dent and further a lid having an excellent thermal conductivity is disposed in the dent to cover the flow-in part, flow-out part, and intermediate position of the refrigerant circulating conduit, and the dented surface portion configured by the dent, and the flow-in part, the flow-out part and the intermediate position of the refrigerant circulating conduit, and the lid are connected thermally to one another.

10. The transmitter according to claim 9, wherein the thermal connection is performed by a friction diffusion bonding.

\* \* \* \* \*